«12» United States Patent
Kim

(10) Patent No.: US 7,598,137 B2
(45) Date of Patent: Oct. 6, 2009

(54) METHOD FOR MANUFACTURING SEMICONDUCTOR DEVICE INCLUDING MIM CAPACITOR

(75) Inventor: Hyung Seok Kim, Incheon Metropolitan (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 200 days.

(21) Appl. No.: 11/319,492

(22) Filed: Dec. 29, 2005

(65) Prior Publication Data

US 2006/0145232 A1 Jul. 6, 2006

(30) Foreign Application Priority Data

Dec. 30, 2004 (KR) .................. 10-2004-0116483

(51) Int. Cl.
*H01L 21/8242* (2006.01)
(52) U.S. Cl. ................ 438/239; 438/957; 257/E21.011
(58) Field of Classification Search .................. 438/239, 438/396, 957
See application file for complete search history.

(56) References Cited

U.S. PATENT DOCUMENTS

| | | | | |
|---|---|---|---|---|
| 5,079,670 A | * | 1/1992 | Tigelaar et al. ............. 361/313 |
| 5,674,771 A | * | 10/1997 | Machida et al. ............. 438/396 |
| 6,239,010 B1 | * | 5/2001 | Lu ............................... 438/592 |
| 6,325,861 B1 | * | 12/2001 | Stinnett ........................ 134/2 |
| 6,534,374 B2 | * | 3/2003 | Johnson et al. ............. 438/381 |
| 7,045,464 B1 | * | 5/2006 | Biolsi et al. ................. 438/706 |
| 7,314,807 B2 | * | 1/2008 | Lee ............................. 438/396 |
| 2006/0134879 A1 | * | 6/2006 | Kim ............................. 438/393 |

\* cited by examiner

*Primary Examiner*—Walter L Lindsay, Jr.
*Assistant Examiner*—Reema Patel
(74) *Attorney, Agent, or Firm*—McKenna Long & Aldridge LLP

(57) ABSTRACT

A semiconductor device including a metal-insulator-metal (MIM) capacitor is manufactured such that a via for connecting upper and lower conductive layers is formed through an insulating interlayer after a silicon nitride layer is deposited as a thick layer on the insulating interlayer. This protects an edge of a MIM structure during an etching process that forms the via. In addition, a fluorine gas can be used in a gas stripping process to remove a polymer residue when stripping the photoresist used to form the via. The MIM capacitor has an insulator layer. The method of manufacturing the device includes forming an insulator layer of the MIM capacitor to a predetermined thickness on the insulating interlayer. The predetermined thickness is equal to the desired thickness plus an augmentation thickness, and the augmentation thickness is determined according to the stripping process for removing the photoresist pattern.

14 Claims, 3 Drawing Sheets

$O_2$ gas stripping of photoresist

METHOD FOR MANUFACTURING SEMICONDUCTOR DEVICE INCLUDING MIM CAPACITOR

This application claims the benefit of Korean Patent Application No. 10-2004-0116483, filed on Dec. 30, 2004, which is hereby incorporated by reference for all purposes as if fully set forth herein.

BACKGROUND OF THE INVENTION

1. Field of the Invention

The present invention relates to a semiconductor device including a metal-insulator-metal (MIM) capacitor. More particularly, the present invention relates to a method for manufacturing such a device in which a via for connecting upper and lower conductive layers is formed through an insulating interlayer after a silicon nitride layer is deposited as a thick layer on the insulating interlayer. An edge region of a MIM capacitor during an etching process to form the via is thereby protected. Also, the use of a fluorine gas to remove a polymer residue during a via pattern photoresist stripping process is thereby enabled.

2. Discussion of the Related Art

A related art MIM capacitor includes upper and lower electrodes, each formed of a patterned layer of metal, such as copper. A semiconductor device including such a capacitor typically comprises a number of metal wiring layers separated by an insulating interlayer, and upper and lower wiring layers electrically connected to each other by a contact plug formed in the insulating interlayer. The insulating interlayer may be made of oxide. In a process for forming the contact plug, photoresist is deposited on the insulating interlayer and is patterned to leave an opening over a pad of the lower wiring layer. The photoresist pattern is used as a mask during an etching process for the insulating interlayer, to thereby form a contact hole or via exposing the underlying pad of the lower wiring layer. The via is then filled with a low-resistance metal, such as tungsten, to improve the contact resistance of the plug. The upper metal layer is then formed over the plug. The plug is formed adjacent the MIM capacitor. The metal wiring layers of the plug may be deposited and patterned at the same time as the electrodes of the capacitor are formed.

An insulator layer of the MIM capacitor is typically formed of a layer of silicon nitride deposited on the insulating interlayer. The insulating interlayer should have a thickness for sufficiently separating the upper and lower wiring layers. Since the upper and lower electrodes of the capacitor should be separated by a minimum distance in order to maximize capacitance, a large step at the edges of the MIM capacitor is typically present. The insulator layer is thus formed over the step, and a photoresist pattern for forming the via is formed on the insulator layer. Thus, the photoresist tends to be thinner at the corners of these stepped edges, permitting an etchant to attack the MIM structure during the etching process for forming the via.

FIGS. 1A-1E are cross-sectional views of a related art MIM capacitor of a semiconductor device and illustrate the above-mentioned etching process being performed with respect to the MIM capacitor. A lower metal layer is formed on a surface of a semiconductor substrate (not shown) and includes a lower electrode 101 and a lower wiring layer 102. The lower electrode 101 and the lower wiring layer 102 may occupy different planes. An insulating interlayer 103 may be formed of an oxide to a thickness such that the lower wiring layer 102 will be separated from an upper wiring layer by a distance A. This distance is typically about 9,000 Å. A silicon nitride layer 104, for isolating the lower electrode 101 from an upper electrode, is formed on the insulating interlayer 103 and has a thickness of approximately 650 to 750 Å. A photoresist layer 105 for forming a via is deposited on the silicon nitride layer 104.

Referring to FIG. 1A, a thin portion 10 of the photoresist layer 105 occurs at the edges of the step of the MIM structure. This thinning phenomenon occurs despite the thickness of the photoresist layer 105. The thinning phenomenon degrades the coating performance and the masking characteristics of the photoresist.

Referring to FIG. 1B, the photoresist layer 105 is subject to exposure and development to form a photoresist pattern. Then, using the photoresist pattern as a mask during an etching process, a via 106 for exposing a pad surface area of the lower wiring layer 102 is formed in the insulating interlayer 103. The etching may result in a damaged region 20, i.e., spiking, at the thinner portion of the photoresist pattern.

Referring to FIG. 1C, a gas stripping process is performed to remove the photoresist pattern. The gas may include oxygen ($O_2$). During and after the stripping process, an undesirable polymer residue 40 may remain. The polymer residue is a severe problem, particularly in a semiconductor device having greater topology variations. The step size increases at the edges of the MIM structure in a semiconductor device having greater topology variations.

Referring to FIG. 1D, after the photoresist pattern is removed, the via 106 may be filled with a material, such as tungsten. The material may be formed as a thick layer on the entire substrate. The thick layer is then planarized by, for example, chemical-mechanical polishing, to leave a plug 106a, such as a tungsten plug, in the via. Simultaneously, the damaged region 20 is also filled with the material, such as tungsten, to form a conductive notch 106b that may reach the lower electrode 101 by piercing the silicon nitride layer 104.

Referring to FIG. 1E, an upper electrode 107 is formed on the silicon nitride layer 104 to correspond to the lower electrode 101, and an upper wiring layer 108 is formed on the plug 106a to connect to the lower wiring layer 102. Thus, the conductive notch 106b causes an electrical short between the lower electrode 101 and the upper electrode 107.

FIG. 2 shows the polymer residue remaining near the edges of the related art MIM structure after via etching and photoresist stripping and before tungsten deposition. The polymer residue remains even after photoresist stripping, which is typically performed by an oxygen ($O_2$) gas stripping process. The polymer residue unfavorably changes the characteristics of the MIM capacitor and causes uncontrollable variations in a desired capacitance value. Though photoresist stripping and polymer removal can be improved by stripping using other gases, such alternative techniques are too aggressive for the insulator layer of a MIM capacitor and thus lead to lower yields.

SUMMARY OF THE INVENTION

Accordingly, the present invention is directed to a method for manufacturing a semiconductor device including a MIM capacitor that substantially obviates one or more problems due to limitations and disadvantages of the related art.

An advantage of the present invention is to provide a method for manufacturing a semiconductor device including a MIM capacitor, which prevents MIM-structure edges from being attacked or damaged in a via etching process.

Another advantage of the present invention is to provide a method for manufacturing a semiconductor device including a MIM capacitor, which enables the use of a fluorine group gas in stripping a photoresist pattern after via etching.

Another advantage of the present invention is to provide a method for manufacturing a semiconductor device including a MIM capacitor, which improves yield.

Additional features and advantages of the invention will be set forth in the description which follows, and will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, a semiconductor device including a metal-insulator-metal (MIM) capacitor includes a lower wiring layer, an upper wiring layer, an insulator layer having a predetermined thickness, wherein the predetermined thickness is equal to a desired thickness and an augmentation thickness based on a stripping process for removing a photoresist pattern, an insulating interlayer separating the upper wiring layer and the lower wiring layer, a via formed in the insulating interlayer; and a plug formed in the via.

In another aspect of the present invention, a method of manufacturing a semiconductor device including a metal-insulator-metal (MIM) capacitor includes forming a lower wiring layer and an upper wiring layer, forming an insulating interlayer separating the upper wiring layer and the lower wiring layer, forming an insulator layer made of nitride on the insulating interlayer to a predetermined thickness, forming a photoresist pattern on the insulating interlayer for via formation, forming a via by an etching process performed on the insulating interlayer, and removing the photoresist pattern using a gas stripping process, wherein the predetermined thickness is equal to a desired thickness plus an augmentation thickness, the augmentation thickness determined according to the stripping process for removing the photoresist pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

According to the present invention, a semiconductor device includes a metal-insulator-metal (MIM) capacitor, which has an insulator layer of a desired thickness. The thickness may be approximately 650 to 750 Å. The MIM capacitor may include an insulator layer formed of a nitride film, disposed between upper and lower electrodes of metal, e.g., copper, corresponding to upper and lower wiring layers of the semiconductor device. The insulator layer may be formed on the insulating interlayer, and a via is formed in the insulating interlayer by performing an etching process on the insulator layer and the insulating interlayer. The etching process includes the formation and subsequent removal of a photoresist pattern, using a gas stripping process.

In the method of the present invention, the insulator layer may be formed to a predetermined thickness on the insulating interlayer. The predetermined thickness may be equal to the desired thickness plus an augmentation thickness. The predetermined thickness is determined in advance and is based on the gas stripping process that removes the via formation photoresist pattern. The predetermined thickness of the present invention is a carefully controlled thickness, and may be approximately 950 to 1,050 Å. The augmentation thickness may be 300 Å. Therefore, the gas stripping process used in the etching process of the method of the present invention thins the insulator layer by a known amount. The known amount may be approximately 200 to 400 Å.

Figure 1A:
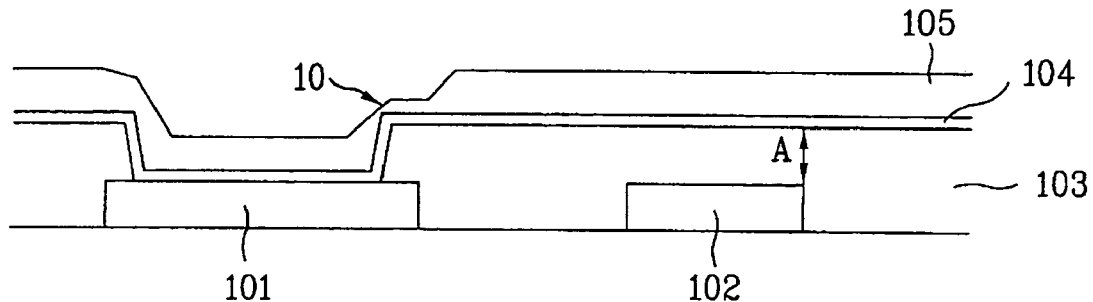
FIGS. 1A-1E are cross-sectional views of a semiconductor device including a related art MIM capacitor, respectively illustrating sequential steps of a method according to a related art.
Figure 1B:
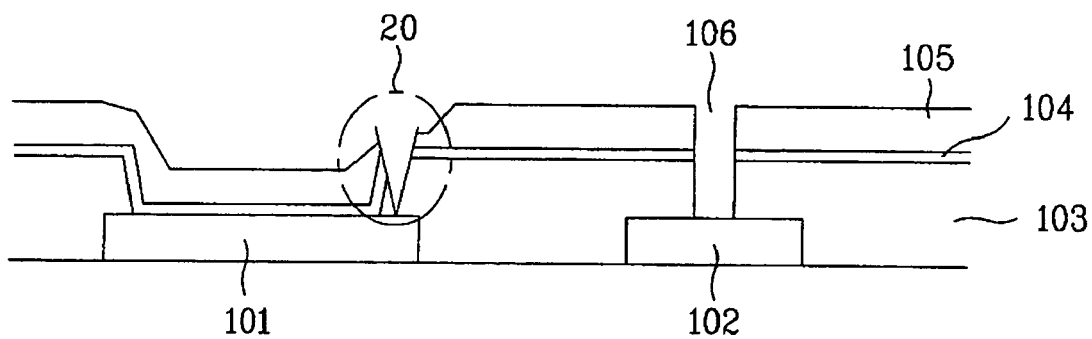
Figure 1C:
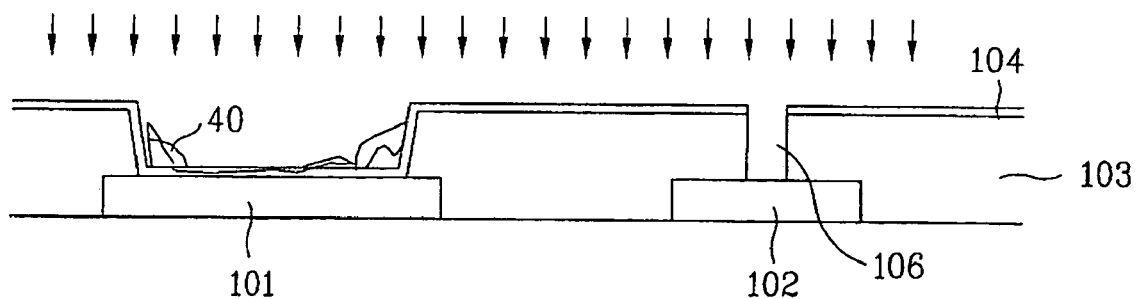
Figure 1D:
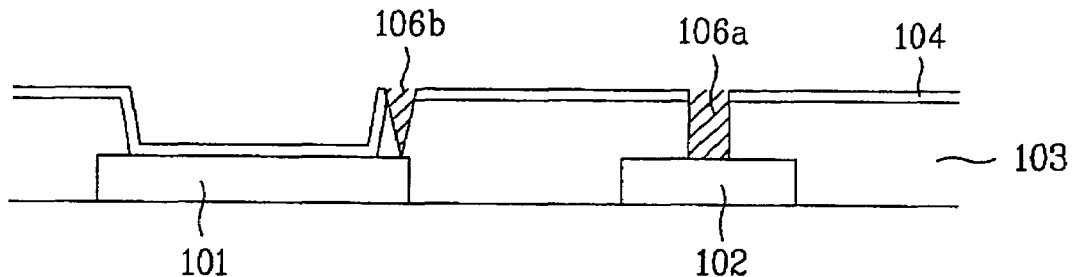
Figure 1E:
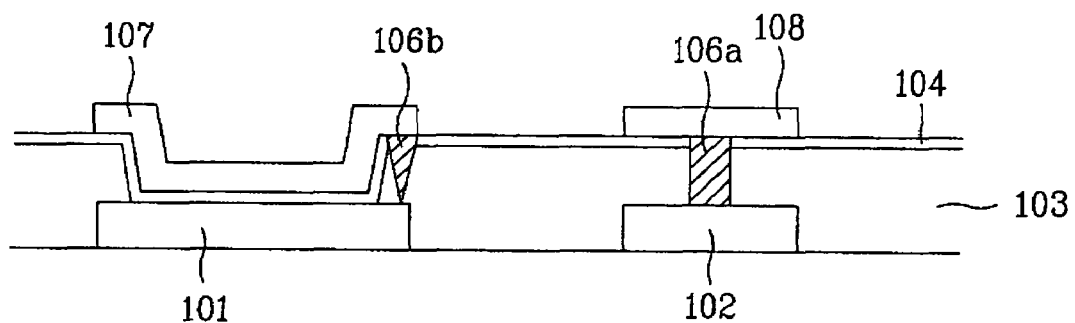
Figure 2:
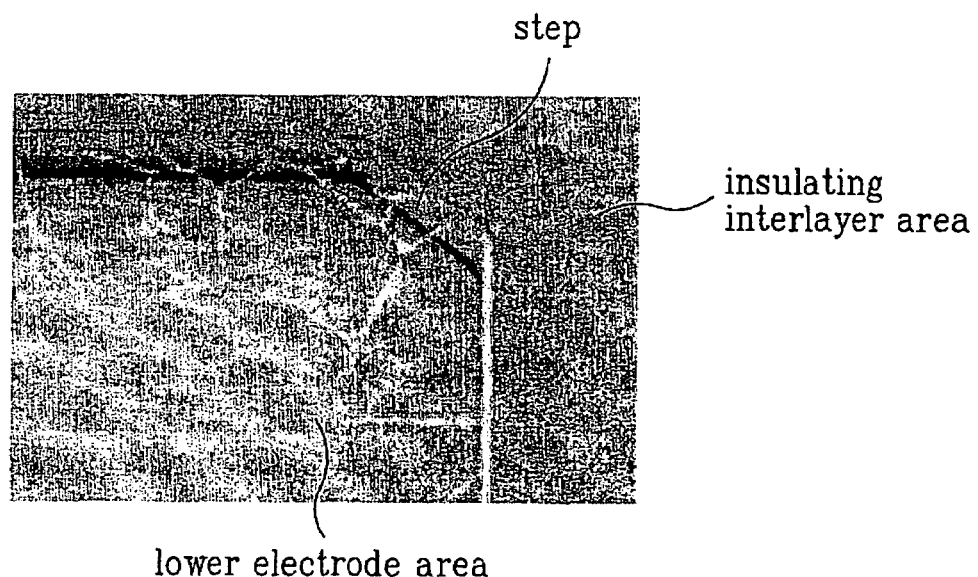
FIG. 2 is a top-view photograph of a MIM structure resulting from a photoresist stripping step in the etching process of FIGS. 1A-1E.
Figure 3:
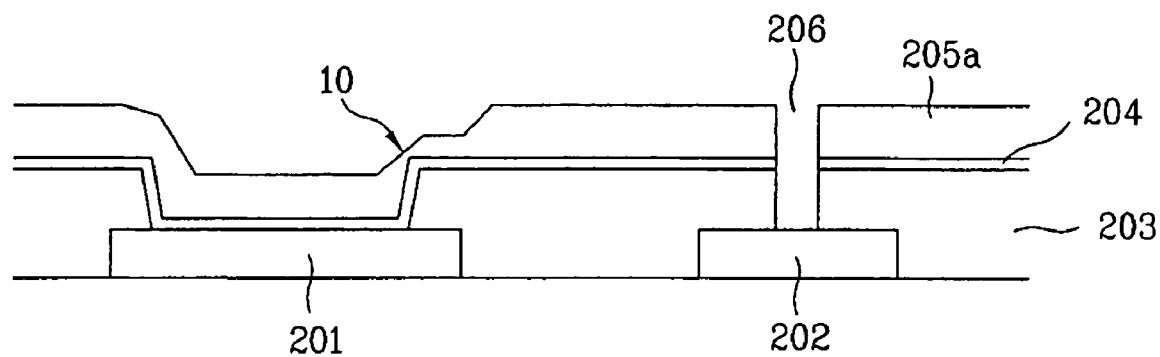
FIG. 3 is a cross-sectional view of a semiconductor device including MIM capacitor manufactured according to an exemplary embodiment of the present invention.

FIG. 3 illustrates a semiconductor device including a MIM capacitor manufactured according to an exemplary embodiment of the present invention. The device includes a photoresist pattern 205a for a via 206. A thin portion 10 of the photoresist pattern 205a occurs at the edges of the step of the MIM structure above a lower electrode 201 formed on a surface of a semiconductor substrate (not shown). The device also includes lower wiring layer 202 and an insulating interlayer 203. The lower electrode 201 is formed by patterning a metal layer, which may be made of copper. An upper electrode (not shown) is formed by patterning another metal layer, which may be made of copper, to correspond to the lower electrode 201. A nitride layer 204, which may include silicon, is formed on the lower electrode 201 to separate the lower and upper electrodes. In an exemplary embodiment, the nitride layer 204 has a thickness of approximately 950 to 1,050 Å, and may have a thickness of 1,000 Å. This thickness is an augmentation to the thickness of the insulator layer, which may be made of nitride, of a typical MIM capacitor. The augmented thickness allows the edges of the MIM capacitor according to the present invention to be protected during the via etching. The via etching is highly selective to an oxide of the insulating interlayer 203 as opposed to the nitride layer 204. Spiking can thus be avoided. The thicker nitride layer 204 also enables $O_2$ stripping with a fluorine group gas.

Figure 4:
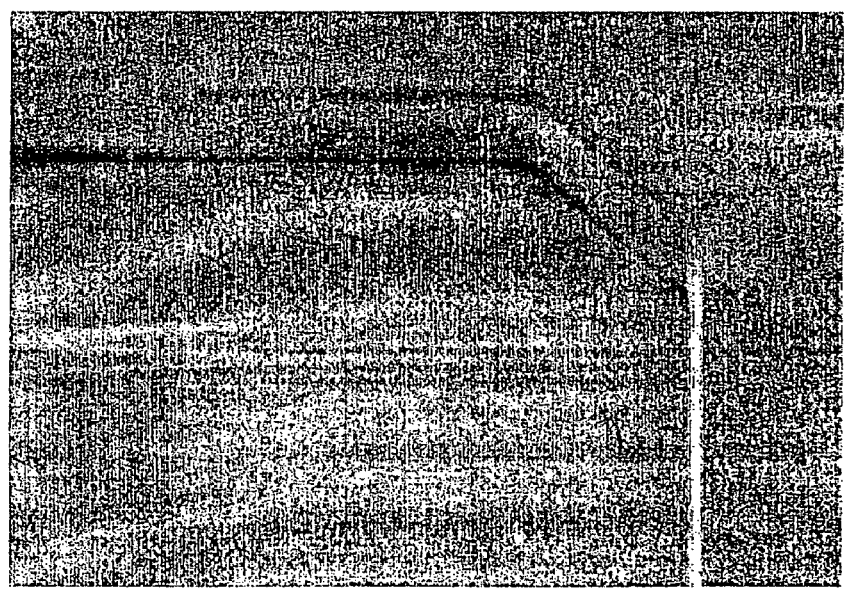
FIG. 4 is a top-view photograph of the MIM capacitor of FIG. 3 after an $O_2$ stripping of a photoresist pattern stripping process using a fluorine group gas.

When oxygen ($O_2$) stripping is performed with a fluorine group gas (e.g., $CF_4$, $C_2F_6$, or $SF_6$) mixed with the oxygen, the polymer residue can be removed completely, as shown in FIG. 4. Simultaneously, approximately 200 to 400 Å, and preferably, 300 Å, of the nitride layer 204 is removed together with the photoresist pattern 205a. Thus, the ultimately formed nitride layer, i.e., after $O_2$ stripping, has a desired thickness of approximately 650 to 750 Å. That is, approximately 200 Å is the minimum removed thickness of the nitride layer and approximately 400 Å is the maximum removed thickness of the nitride layer, when the nitride layer is initially deposited to a thickness of approximately 950 to 1,050 Å.

By adopting the method for manufacturing a semiconductor device including a MIM capacitor according to the present invention, spiking can be prevented. That is, since the nitride layer is formed as a thicker layer, a via etching process can be performed without damaging the edges of the MIM-structure, thereby preventing spiking. In addition, the thickness of the nitride layer is carefully determined according to a photoresist stripping process performed after via etching. This enables the use of a fluorine group gas in an $O_2$ stripping step to remove a polymer residue. Thus, the capacitance of the MIM capacitor can be accurately controlled and yield can be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a semiconductor device including a metal-insulator-metal (MIM) capacitor, comprising:
    forming a lower wiring layer;
    forming an insulating interlayer on the lower wiring layer;
    forming an insulator layer made of nitride on an upper surface of the insulating interlayer to a predetermined thickness;
    forming a photoresist pattern for via formation;
    forming a via by an etching process performed on the insulating interlayer; and
    removing the photoresist pattern using a gas stripping process,
    wherein the predetermined thickness is equal to a desired thickness plus an augmentation thickness, the desired thickness is approximately 650 to 750 Å, and the augmentation thickness is 300 Å.

2. The method of claim 1, wherein the gas stripping process thins the insulator layer by approximately 200 to 400 Å.

3. The method of claim 1, wherein the predetermined thickness is 1,000 Å.

4. The method of claim 1, wherein the etching process comprises:
    forming the photoresist pattern on the insulator layer made of nitride;
    etching the insulator layer made of nitride and the insulating interlayer according to the photoresist pattern; and
    removing the photoresist pattern after said etching.

5. The method of claim 4, wherein forming the photoresist pattern comprises:
    depositing photoresist layer on the insulator layer made of nitride; and
    subjecting the photoresist layer to exposure and development processing.

6. The method of claim 4, wherein etching the insulator layer made of nitride and the insulating interlayer forms a contact hole exposing a pad surface area of the lower wiring layer.

7. The method of claim 1, wherein the gas stripping process is an O2 stripping process.

8. The method of claim 7, wherein the gas of the gas stripping process is a fluorine group gas.

9. The method of claim 8, wherein the gas of the gas stripping process is one selected from $CF_4$, $C_2F_6$, and $SF_6$.

10. The method of claim 7, wherein the gas stripping process removes a polymer residue from a surface of the insulator layer made of nitride formed in a MIM edge region.

11. The method of claim 1, wherein the insulator layer made of nitride is formed of silicon nitride.

12. The method of claim 1, wherein the insulating interlayer is formed of an oxide.

13. The method of claim 1, wherein the insulating interlayer and the insulator layer are formed to have a high etching selectivity ratio of the insulating interlayer to the insulator layer.

14. The method of claim 1, further comprising:
    patterning a metal layer of copper to form a lower electrode of the MIM capacitor on a surface of a semiconductor substrate;
    forming the insulator layer to include silicon on the lower electrode; and
    patterning a metal layer of copper to form an upper electrode of the MIM capacitor of a patterned copper layer on the insulator layer.

* * * * *